(12) United States Patent
Higashitsutsumi

(10) Patent No.: US 7,170,046 B2
(45) Date of Patent: Jan. 30, 2007

(54) COLOR IMAGE CAPTURE ELEMENT AND COLOR IMAGE SIGNAL PROCESSING CIRCUIT

(75) Inventor: Yoshihito Higashitsutsumi, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/020,987

(22) Filed: Dec. 22, 2004

(65) Prior Publication Data

US 2005/0133690 A1 Jun. 23, 2005

(30) Foreign Application Priority Data

Dec. 22, 2003 (JP) ............... 2003-425708

(51) Int. Cl.
*G01J 3/50* (2006.01)
*H01J 5/16* (2006.01)
*H01J 40/14* (2006.01)

(52) U.S. Cl. ............... 250/226; 250/208.1; 250/339.02; 348/273; 348/282; 348/315; 359/350

(58) Field of Classification Search ............ 250/208.1, 250/226, 216, 339.01, 339.02, 339.15, 330; 359/359, 890, 891, 350; 348/336, 273, 274, 348/315, 282; 356/402, 404, 416, 419; 257/432, 257/294, 440

See application file for complete search history.

(56) References Cited

U.S. PATENT DOCUMENTS

| | | | |
|---|---|---|---|
| 6,211,521 B1* | 4/2001 | Bawolek et al. | 250/339.02 |
| 6,486,974 B1* | 11/2002 | Nakai et al. | 358/1.9 |
| 6,657,663 B2* | 12/2003 | Morris | 348/273 |

FOREIGN PATENT DOCUMENTS

| | | |
|---|---|---|
| JP | 11-239356 | 8/1999 |
| WO | 00/07365 | 2/2000 |

* cited by examiner

*Primary Examiner*—Stephone B. Allen
*Assistant Examiner*—Suezu Ellis
(74) *Attorney, Agent, or Firm*—Hogan & Hartson LLP

(57) ABSTRACT

A color image capture element comprises a plurality of color component photoelectric conversion elements, each disposed with a color filter on a light receiving surface for respectively transmitting different color components, for receiving incoming light and selectively outputting respective color signals corresponding to the intensity of the different color components, and an infrared component photoelectric conversion element, disposed with an infrared transmitting filter on a light receiving surface for transmitting an infrared component, for selectively outputting an infrared signal. This enables the infrared component included in at least one of a plurality of color signals to be corrected, thereby improving the sensitivity of a color image capture apparatus.

7 Claims, 7 Drawing Sheets

COLOR IMAGE CAPTURE ELEMENT AND COLOR IMAGE SIGNAL PROCESSING CIRCUIT

CROSS-REFERENCE TO RELATED APPLICATION

The entire disclosure of Japanese Patent Application No. 2003-425708 including specification, claims, drawings, and abstract is incorporated herein by reference.

BACKGROUND OF THE INVENTION

1. Field of the Invention

The present invention relates to a color image capture element that is sensitive to light in the infrared region and to a color image signal processing circuit.

2. Description of the Related Art

Image capture elements, such as charge coupled devices (CCD) and complementary metal oxide semiconductors (CMOS) mounted in cameras, are arranged in two dimensions and comprise photoelectric conversion elements for converting light into electric signals. Since the photoelectric conversion element itself does not have any capability to distinguish color, color images are captured by performing color separation on the incoming light, such as with color filters, and performing photoelectric conversion on each color separated light. Color separation of the incoming light is generally performed by color filter layers of the three primary colors (RGB) or the complementary colors (YMC).

Furthermore, compared to the wavelength of light of approximately 380 nm to 780 nm that is visible to the human eye, an ordinary photoelectric conversion element detects light in a wavelength region of 380 nm to 1100 nm and also has a high sensitivity in the infrared region, which has a longer wavelength than visible light. When the photoelectric conversion element, which outputs signals corresponding to the intensity of the respective colors after color separation of the incoming light, also outputs light components in the infrared region, which is invisible to the human eye, true color reproduction cannot be achieved. Accordingly, an infrared-cut filter is disposed between camera lens and photoelectric conversion element so that infrared light does not enter the photoelectric conversion element.

Although the infrared-cut filter that is provided for true color reproduction cuts any light having a wavelength in the infrared region, it also simultaneously cuts approximately 10% to 20% of visible light. Therefore, the intensity of the visible light striking the light receiving surface of the photoelectric conversion element decreases, and as a result the S/N ratio of the output signal drops, thereby creating a problem inducing image deterioration. Particularly in European cultures, indirect illumination with incandescent bulbs having a large amount of infrared components in the emission spectrum is commonly used so that such indoor illumination is relatively dark. An improvement in sensitivity of the capture element is thus desirable to perform image capture at a high S/N ratio even under such low illumination.

Switchable monochrome/color cameras have been proposed wherein the output of the CCD is monitored so that when the CCD output level is large (such as during the day when the light is strong), an infrared-cut filter is inserted between the lens and CCD before color images are captured, and when the CCD output level is small (such as during the night when the light is weak), the infrared-cut filter is automatically switched to a dummy glass.

Furthermore, for capturing images under a variety of illumination light sources, a color image capture apparatus in general automatically adjusts the gain for the RGB signals so that the white balance is correct regardless of the type of light source under which the image was captured.

Higher sensitivity is desirable in color image capture apparatuses so that vivid color images can be captured even in dark environments. To achieve higher sensitivity, many methods are adopted, such as dropping the frame rate, opening the lens aperture, and raising the gain of the signal amplification. However, these methods cause problems, such as the resulting afterimage, shallower depth of field, increased noise, and so forth.

Consequently, a method was devised to remove the infrared-cut filter, which causes a loss in the visible light as described hereinabove, and efficiently guide the incoming light to the photoelectric conversion element. However, this still resulted in a problem making it impossible to achieve correct color reproduction. Furthermore, it has become desirable to remove the infrared-cut filter in the color image capture element also from the viewpoint of miniaturization and lower cost.

SUMMARY OF THE INVENTION

The color image capture element of the present invention comprises a plurality of color component photoelectric conversion elements, each disposed with a color filter on light receiving surfaces for respectively transmitting different color components, for receiving incoming light and selectively outputting respective color signals corresponding to the intensity of the different color components, and an infrared component photoelectric conversion element, disposed with an infrared component transmitting filter on a light receiving surface for transmitting an infrared component, for selectively outputting an infrared signal used to correct the infrared component included in at least one of a plurality of color signals.

DETAILED DESCRIPTION OF THE PREFERRED EMBODIMENTS

Preferred embodiments (referred to as embodiments hereinafter) are described hereinafter with reference to the attached drawings.

Figure 1:
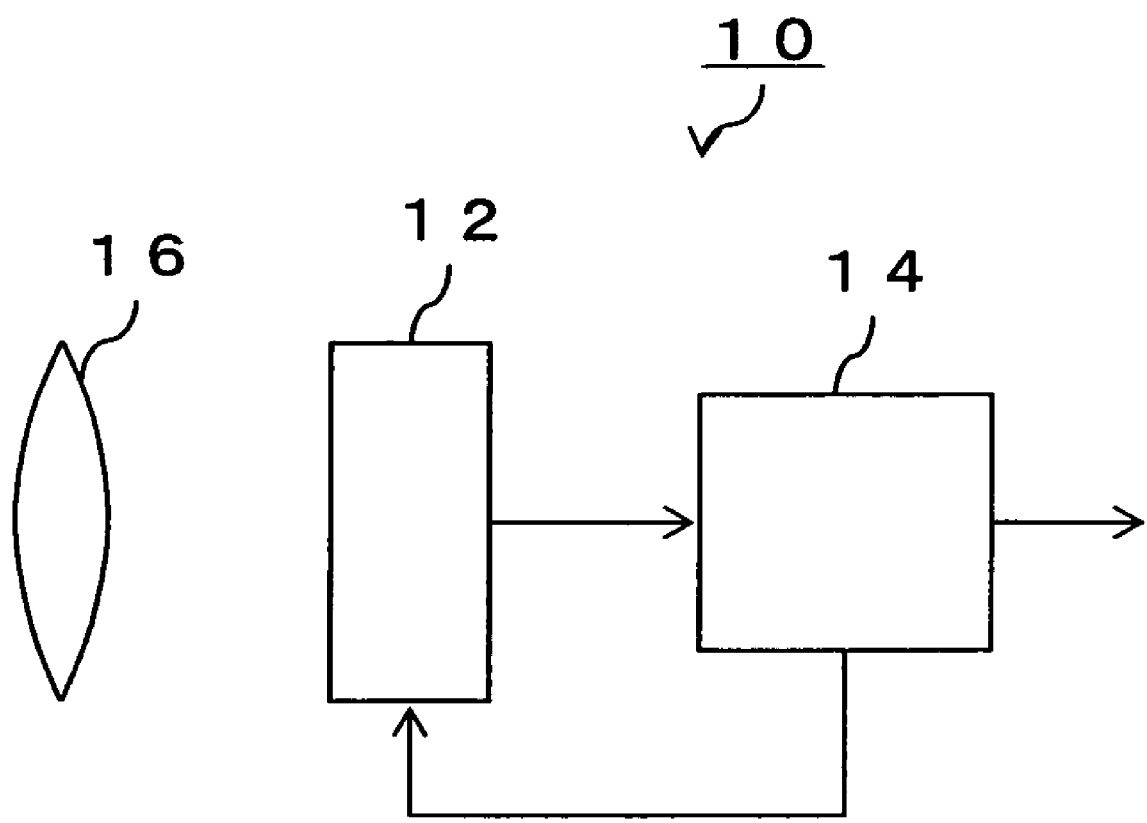
FIG. 1 is a block diagram showing a configuration of the image signal relationship of a color image capture apparatus relating to an embodiment of the present invention.

FIG. 1 is a block diagram showing a configuration of the image signal relationship of a color image capture apparatus 10 relating to an embodiment of the present invention. The color image capture apparatus 10 comprises a color image capture element 12 for converting the intensity by color of incoming light and outputting into electric signals. A color signal processing circuit 14 produces a picture signal from the color separated signals that are output by the color image capture element 12. A lens 16 is provided to form an image on the light receiving surface of the color image capture element 12.

Figure 2:
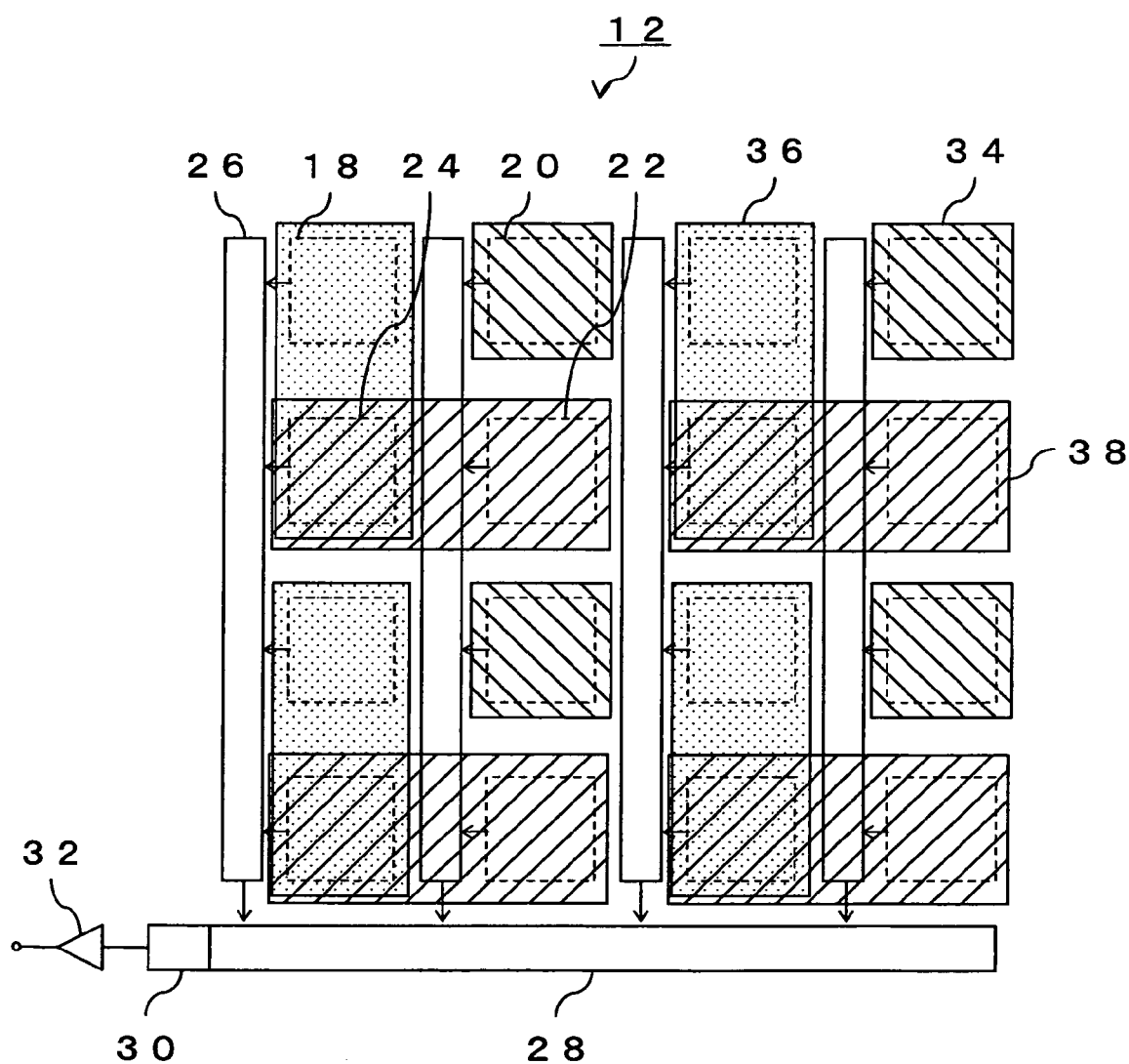
FIG. 2 schematically shows a configuration of a color image capture element relating to the embodiment of the present invention.

FIG. 2 schematically shows a configuration of the color image capture element relating to the embodiment of the present invention. An example using a charge coupled device (CCD) for the color image capture element 12 will be described here. The color image capture element 12 comprises a plurality of photoelectric conversion element blocks, each configured from four photoelectric conversion elements 18, 20, 22, 24 for converting light into electric signals, arranged in two dimensions to form the light receiving surface. For example, the photoelectric conversion elements are configured from Si photodiodes. Charges converted by the photoelectric conversion elements are transferred to a vertical register 26, and then transferred to a horizontal register 28. The signal charges transferred by the horizontal register 28 are converted into an electric signal at a charge-voltage converter circuit 30. The electric signal undergoes current amplification at an amplifier 32, such as a source-follower circuit, and it output to the color signal processing circuit 14.

For color separation in the photoelectric conversion element block formed from four photoelectric conversion elements 18, 20, 22, 24, a red filter 36 is disposed at the light receiving surface that guides the incoming light for the first photoelectric conversion element 18, a green filter 34 is disposed at the light receiving surface that guides the incoming light for the second photoelectric conversion element 20, and a blue filter 38 is disposed at the light receiving surface that guides the incoming light for the third photoelectric conversion element 22. The arrangement of photoelectric conversion elements disposed with filters of different colors distributed without color bias in two dimensions is called a mosaic array.

A feature of the present invention is that an infrared transmitting filter is disposed at the light receiving surface that guides the incoming light for the fourth photoelectric conversion element 24. The fourth photoelectric conversion element 24 selectively outputs an infrared signal for correcting the infrared component included in at least one of the color signals that the first to third photoelectric conversion elements selectively output.

In this embodiment, at least two types of color filters are color filters that transmit infrared light and the infrared component transmitting filter is formed by superimposing the color filter that transmits infrared light among the color filters. For example, the infrared transmitting filter is formed by superimposing the red filter and the blue filter. Furthermore, this red filter is an extension of the red filter 36, which is disposed on the light receiving surface that guides the incoming light for the first photoelectric conversion element 18, onto the light receiving surface of the fourth photoelectric conversion element 24. Similarly, the blue filter is an extension of the blue filter 38, which is disposed on the light receiving surface that guides the incoming light for the third photoelectric conversion element 22, onto the light receiving surface of the fourth photoelectric conversion element 24. According to this configuration, appropriate color reproduction is possible even if a color component photoelectric conversion element outputs a color signal that includes an infrared component thereby obviating an infrared-cut filter at the light receiving surface of the color component photoelectric conversion element. Therefore, since the loss in the visible light component due to an infrared-cut filter on the light receiving surface of the color component photoelectric conversion element can be excluded, the sensitivity of the color image capture element increases. Furthermore, at least one color component photoelectric conversion element obtains a luminance signal also from the infrared component in addition to the visible light component so that the sensitivity of the color image capture element drastically improves. Moreover, the infrared transmitting filter can be formed from the red filter and the blue filter without the addition of a new manufacturing process. Therefore, a low cost and high sensitivity color image capture element can be realized.

In FIG. 2, the red filter 36 and the blue filter 38 assumed their forms by shaping each photoelectric conversion element block comprised by four photoelectric conversion elements. However, if the red filter 36 and the blue filter 38 are disposed respectively on the light receiving surfaces that guide the incoming light to the first photoelectric conversion element 18 and the fourth photoelectric conversion element 24 and on the light receiving surfaces that guide the incoming light to the third photoelectric conversion element 22 and the fourth photoelectric conversion element 24, the shape may be of any form. For example, the red filter 36 may be formed into an integrated piece on one line of photoelectric conversion elements that have been arranged in two dimensions, and the blue filter 38 may be formed into an integrated piece on one line of photoelectric conversion elements that have been arranged in two dimensions.

Figure 3:
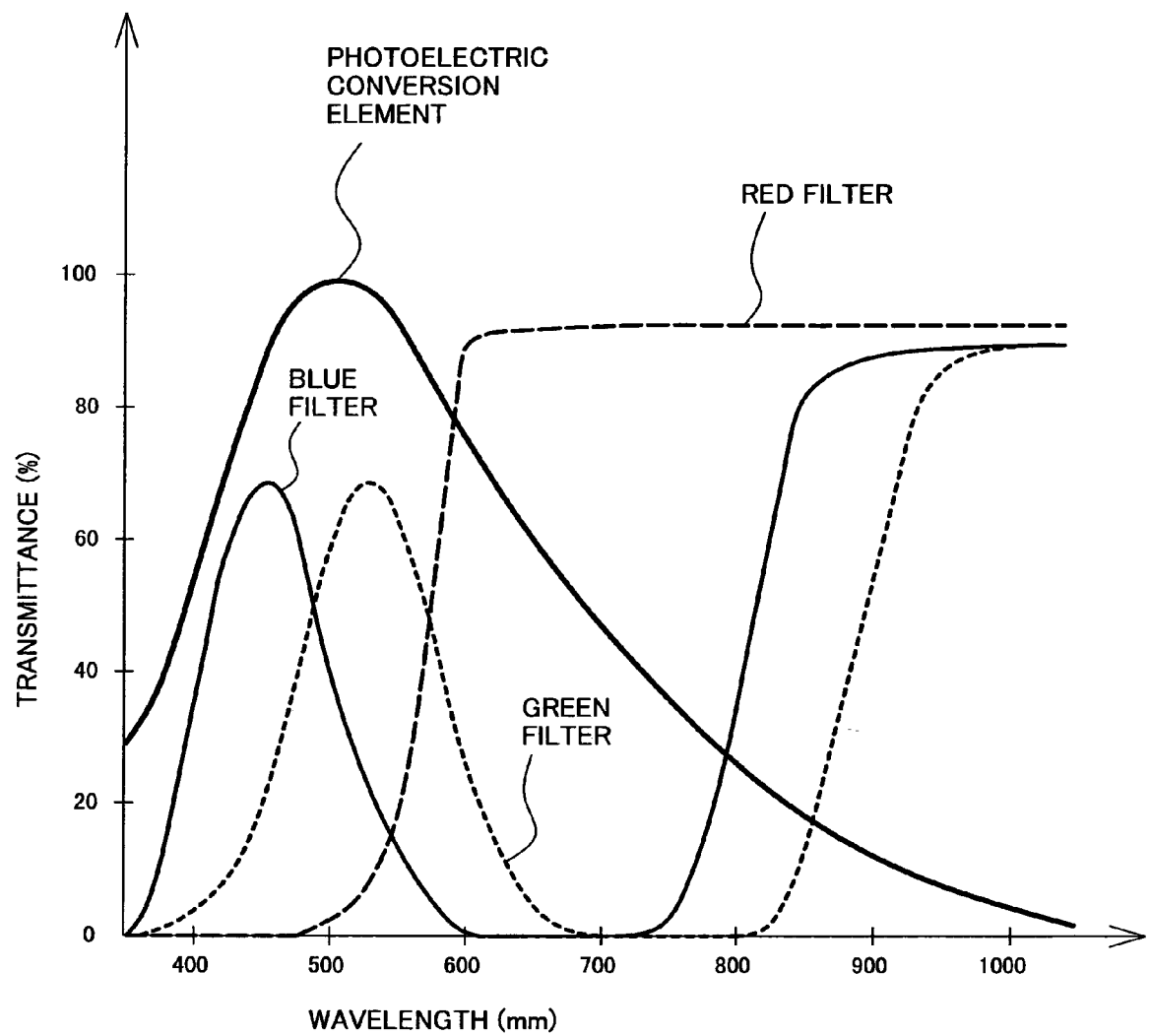
FIG. 3 shows an example of the transmittance of a red filter, a green filter, and a blue filter, as well as an example of the wavelength dependence of the light receiving sensitivity of a charge coupled device.

FIG. 3 shows an example of a wavelength distribution of the transmittance of the red filter 36, the green filter 34, and the blue filter 38 and an example of a wavelength dependence of the light receiving sensitivity of the integrated photoelectric conversion element. The red filter 36 does not transmit light having a wavelength shorter than approximately 550 nm and has a high transmittance for light having a wavelength longer than approximately 550 nm. The green filter 34 has increased transmittance for light having a wavelength longer than approximately 450 nm, peaks at approximately 520 nm, which is green light, has practically no transmittance for light having a wavelength longer than approximately 650 nm, and again has a high transmittance for light having a wavelength of approximately 800 nm and longer, which is infrared light. The blue filter 38 has increased transmittance for light having a wavelength longer than approximately 380 nm, peaks at approximately 460 nm, which is blue light, has practically no transmittance for light having a wavelength longer than approximately 550 nm, and again has a high transmittance for light having a wavelength of approximately 750 nm and longer, which is infrared light. On the other hand, the photoelectric conversion element has a maximum sensitivity at approximately 500 nm and is sensitive beyond 780 nm of the visible light region until the infrared light region of around 1100 nm.

Figure 4:
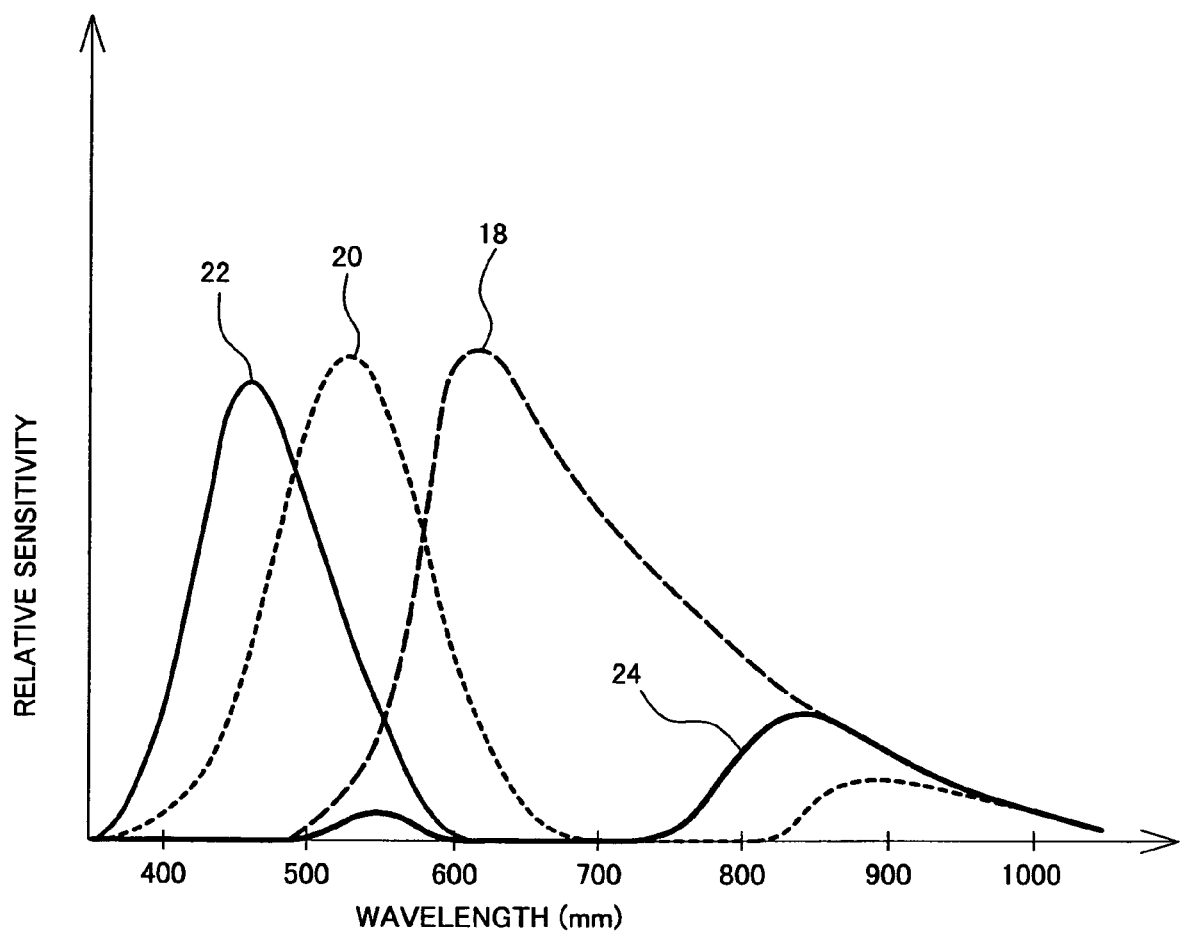
FIG. 4 shows the wavelength dependence of the sensitivity of the photoelectric conversion element when the red filter, green filter, blue filter, and photoelectric conversion element are disposed as shown in FIG. 2.

The wavelength dependence of the sensitivity of the photoelectric conversion elements 18, 20, 22, 24 is shown in FIG. 4 for the case where the red filter 36, the green filter 34, the blue filter 38, and the photoelectric conversion element having the transmitted wavelength distributions as described hereinabove are disposed as shown in FIG. 2.

The first photoelectric conversion element 18, having the red filter 36 disposed on the light receiving surface that guides the incoming light, has a sensitivity distribution with a peak at approximately 600 nm for red light and is sensitive to the infrared light region for the photoelectric conversion element 18. The second photoelectric conversion element 20, having the green filter 34 disposed on the light receiving surface that guides the incoming light, has a sensitivity distribution with a peak at approximately 520 nm for green light in the visible light region and is sensitive to the infrared light region since the green filter 34 transmits infrared light. The third photoelectric conversion element 22, having the blue filter 38 disposed on the light receiving surface that guides the incoming light, has a sensitivity distribution with a peak at approximately 460 nm for blue light in the visible light region and is sensitive to the infrared light region since the blue filter 38 transmits infrared light. The fourth photoelectric conversion element 24, having the red filter 36 and the blue filter 38 disposed while overlapping on the light receiving surface that guides the incoming light, has practically no sensitivity in the visible light region and has maximum sensitivity in the infrared region at a wavelength of approximately 780 nm and longer.

Therefore, the first photoelectric conversion element 18 converts red and infrared light and outputs a signal R, the second photoelectric conversion element 20 converts green and infrared light and outputs a signal G, the third photoelectric conversion element 22 converts blue and infrared light and outputs a signal B, and the fourth photoelectric conversion element 24 converts infrared light and outputs a signal IR.

Since the color image capture element 12 relating to the embodiment of the present invention has no intervening infrared-cut filter to create a loss in the incoming light at the light receiving surfaces of the first, second, and third photoelectric conversion elements 18, 20, 22 for performing photoelectric conversion of the three primary colors in the visible light region, efficient photoelectric conversion can be performed on the light from a subject. Furthermore, since the first, second, and third photoelectric conversion elements 18, 20, 22 perform photoelectric conversion on both the visible light component and the infrared component so that luminance signals from both the visible light component and the infrared component can be obtained, the sensitivity improves compared to the conventional color image capture element that received only the visible light component.

Since the output signals R, G, and B of the first, second, and third photoelectric conversion elements 18, 20, 22 include the infrared component, correct color reproduction is not possible if these signals are simply processed. Accordingly, the color signal processing circuit 14 obtains the color signals and the infrared signal, and processing is performed to remove the infrared component that is included at least in one color signal on the basis of the infrared signal. Namely, on the basis of the output signal IR for the infrared component from the fourth photoelectric conversion element 24, signal processing is performed to remove the infrared component from the output signals R, G, and B, which include the infrared component, from the first, second, and third photoelectric conversion elements 18, 20, 22. As an example of the signal processing used to remove the infrared component, a signal value obtained by multiplying the output signal IR by the ratio of the sensitivity of the fourth photoelectric conversion element 24 with respect to the infrared sensitivity of the first photoelectric conversion element 18 is subtracted from output signal R. Performing this sort of signal processing on signals that include the infrared component yields the three primary color signals so that appropriate color reproduction can be performed.

Furthermore, the color signal processing circuit 14 obtains the color signals and infrared signal from the color image capture element 12, controls the gain of at least two color signals on the basis of the infrared signal, and adjusts the white balance for the color signals. For example, it is preferable to adjust the white balance for the color signals on the basis of the infrared signal IR and control the gain of the red signal R and the blue signal B using the gain of the green signal G as a reference. In the white balance adjustment for the color signals, for example, if the infrared signal IR is larger than a predetermined signal amount, a control operation is performed so that the gain of the red signal R is reduced by a predetermined amount and the gain of the blue signal B is increased by a predetermined amount. Conversely, if the infrared signal IR is smaller than a predetermined amount, a control operation is performed to equalize the gain of the red signal R and the gain of the blue signal B. Due to the color signal processing circuit 14, an appropriate white balance can be achieved on the basis of the detected infrared signal.

As an example, a CCD was described hereinabove using the color image capture element 12. However, any charge transfer method for the CCD may be adopted. Some methods include frame transfer (FT), interline transfer (IT), and frame interline transfer (FIT). Furthermore, the color image capture element 12 of the present invention is not limited to the use of CCD technology but may also be similarly configured with Complementary Metal Oxide Semiconductor (CMOS) technology.

Moreover, in the color image capture element 12 relating to the embodiment of the present invention, color separation was performed to separate light into the three primary colors of red, green, and blue. However, color separation may also be performed to separate light into the complementary color combination of yellow (Ye), magenta (Mg), and cyan (Cy), or the combination of yellow (Ye), cyan (Cy), and green (G), or the combination of yellow (Ye), cyan (Cy), magenta (Mg), and green (G). In this case, instead of the red filter, green filter, and blue filter, a yellow filter, a magenta filter, and a cyan filter are disposed on the light receiving surface of the photoelectric conversion element. In this case, instead of the Bayer arrangement of the primary colors, these filters use the complementary color difference sequential checkerboard arrangement or the complementary color checkerboard arrangement.

Figure 5:
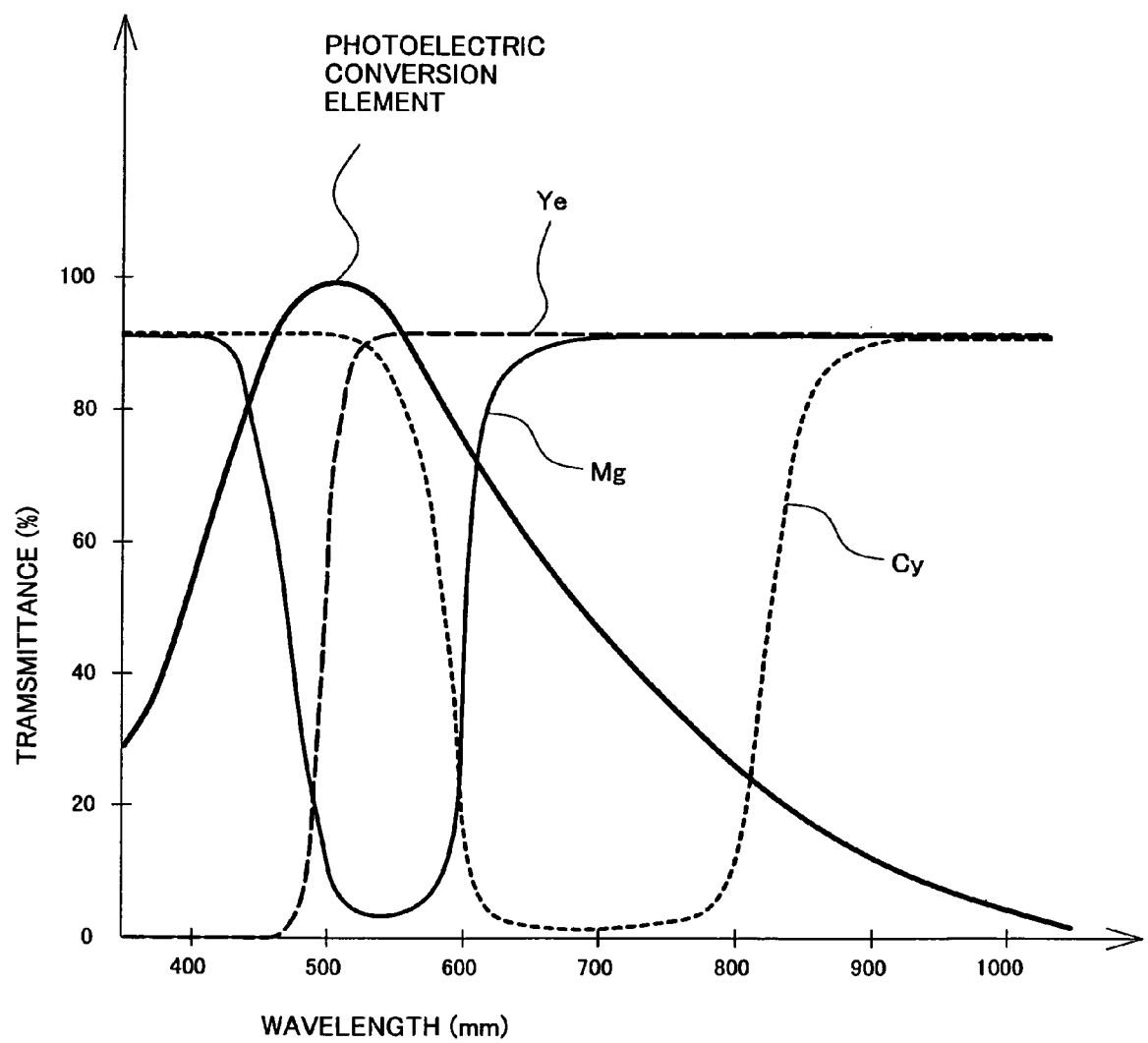
FIG. 5 shows an example of the transmittance of a yellow (Ye) filter, a magenta (Mg) filter, and a cyan (Cy) filter, as well as an example of the wavelength dependence of the light receiving sensitivity of a charge coupled device.

FIG. 5 shows an example of the wavelength distribution of the transmittance of the yellow (Ye), magenta (Mg), and cyan (Cy) filter combination of a complementary color filter, and an example of the wavelength dependence of the light receiving sensitivity of a charge coupled device. The yellow Ye filter transmits light having a wavelength longer than approximately 480 nm, the magenta Mg filter transmits light having a wavelength approximately 450 nm or lower and light having a wavelength approximately 620 nm or higher, and practically does not transmit light having a wavelength from approximately 500 nm to approximately 570 nm, and the cyan Cy filter transmits light having a wavelength approximately 550 nm or lower and light having a wavelength approximately 850 nm or higher, and practically does not transmit light having a wavelength from approximately 600 nm to approximately 800 nm.

Figure 6:
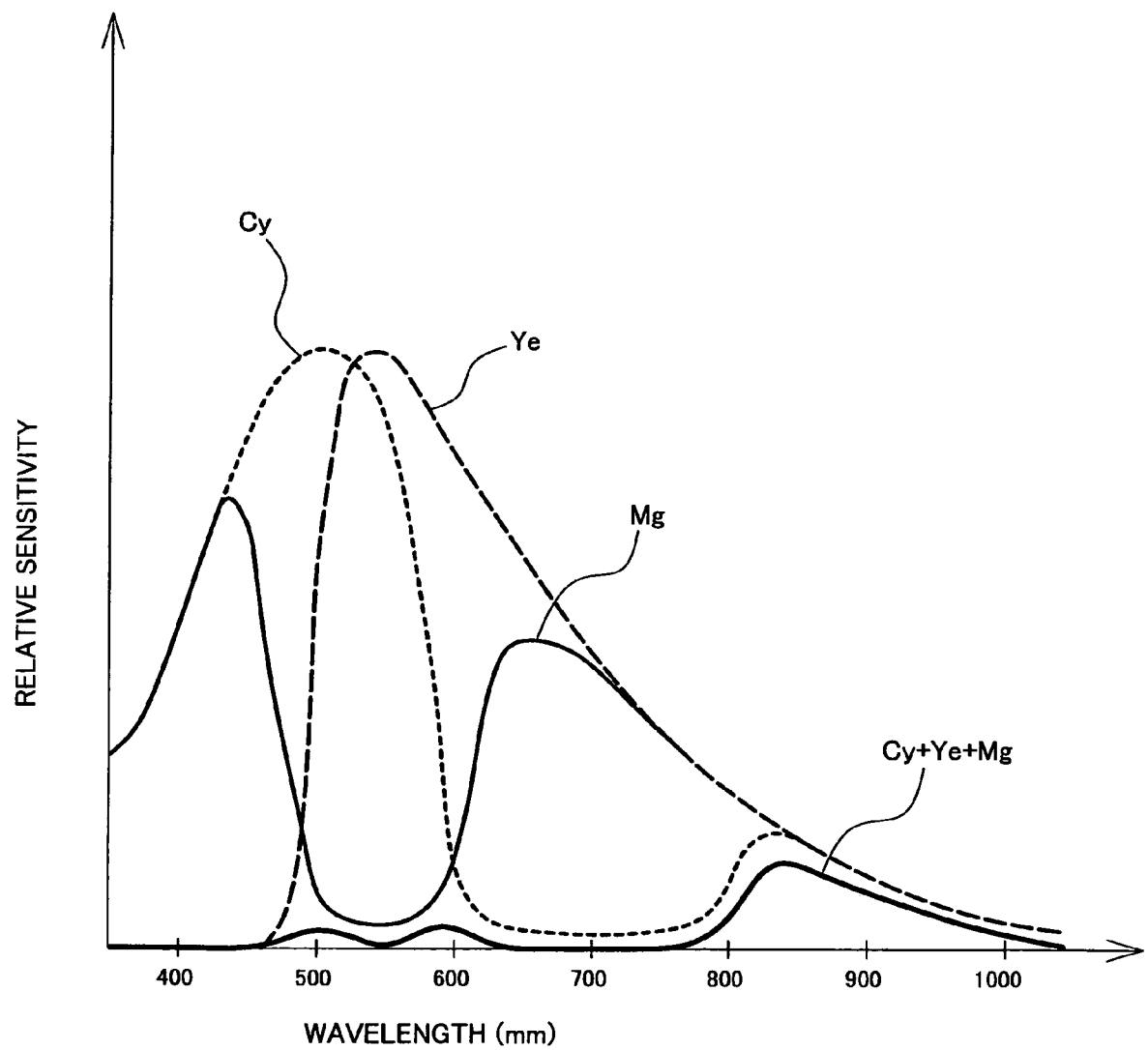
FIG. 6 shows the wavelength dependence of the sensitivity of the photoelectric conversion element when the yellow (Ye), magenta (Mg), and cyan (Cy) filters are respectively disposed on the photoelectric conversion elements.

The wavelength dependence of the sensitivity of the photoelectric conversion element in the case where the yellow (Ye), magenta (Mg), and cyan (Cy) filters having the transmission wavelength distribution described hereinabove are respectively disposed on the photoelectric conversion elements is shown in FIG. 6. The photoelectric conversion element disposed with the yellow Ye filter has a sensitivity distribution with a peak at approximately 520 nm for yellow light and is sensitive to the infrared region. The photoelectric conversion element disposed with the magenta Mg filter has a first sensitivity peak at approximately 420 nm, practically no sensitivity from approximately 500 nm to approximately 570 nm, a second sensitivity peak at approximately 650 nm, and is sensitive to the infrared region. The photoelectric conversion element disposed with the cyan Cy filter has a sensitivity peak at approximately 500 nm, practically no sensitivity from approximately 600 nm to approximately 800 nm, and is sensitive to the infrared region with rising sensitivity from approximately 800 nm and peaking at approximately 850 nm.

In this case, the yellow Ye, magenta Mg, and cyan Cy filters are superimposed to form the infrared transmitting filter on the light receiving surface of the fourth photoelectric conversion element 24, which performs photoelectric conversion only on light of the infrared region and selectively outputs signal IR. At this time, the fourth photoelectric conversion element 24 has practically no sensitivity in the visible light region as shown in FIG. 6 and has maximum sensitivity in the infrared region to light having a wavelength of approximately 800 nm or higher. The present invention is applicable even for a filter configuration used for complementary color separation in the same manner as the color image capture element 12 relating to the embodiment for the filter configuration separating the red, green, and blue colors as described hereinabove.

Figure 7:
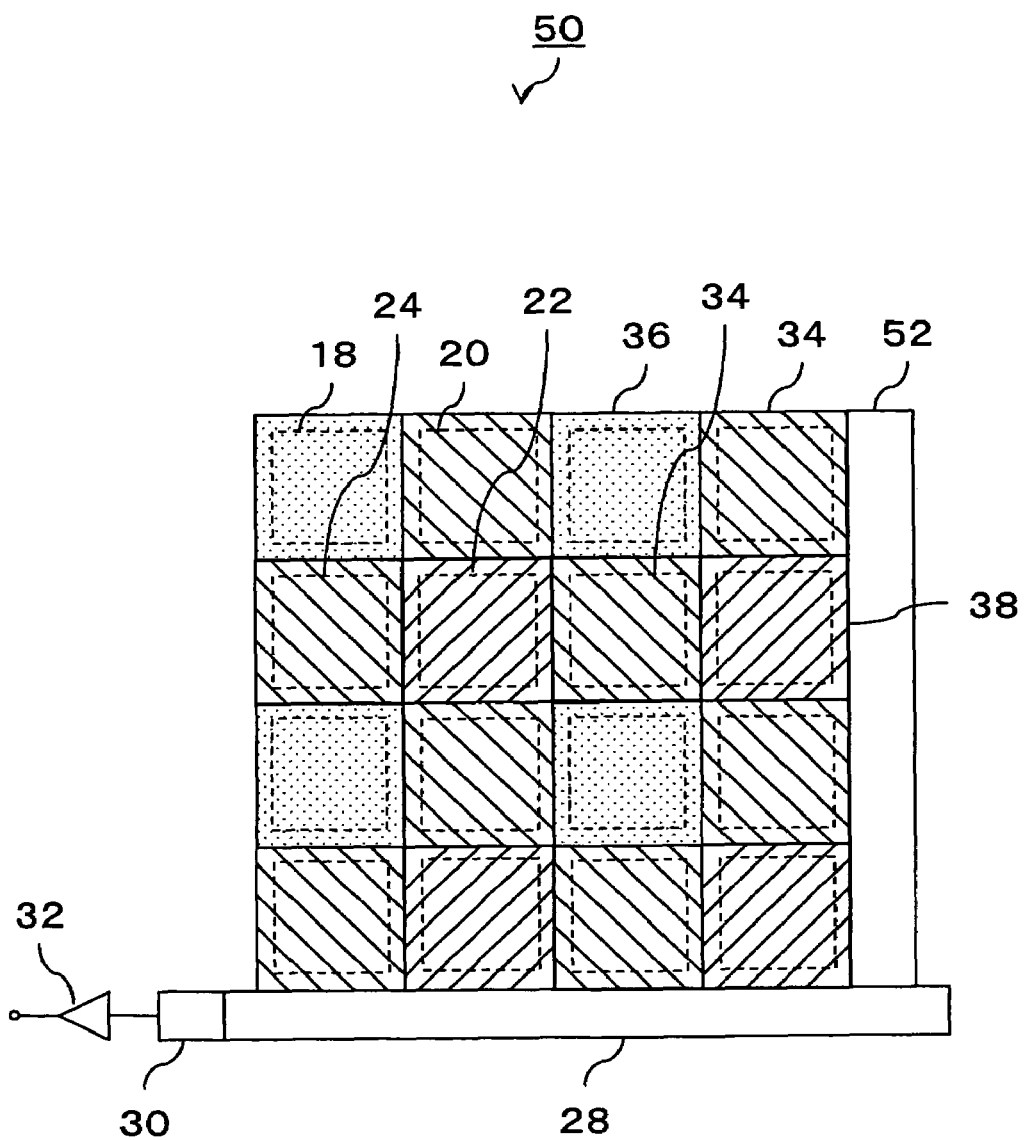
FIG. 7 schematically shows a configuration of a color image capture element relating to another embodiment of the present invention.

FIG. 7 schematically shows a configuration of a color image capture element 50 relating to another embodiment of the present invention. The color image capture element 50 is an IT CCD comprising a photoelectric conversion element 52, which performs photoelectric conversion only for infrared light, at the right edge of the image capture surface, which is on the outer edge of the light receiving surface disposed with an on-chip color filter having a conventional primary color Bayer arrangement. The red filter 36 for guiding incoming light is disposed on the light receiving surface of the first photoelectric conversion element 18, the green filter 34 for guiding incoming light is disposed on the light receiving surfaces of the second photoelectric conversion element 20 and the fourth photoelectric conversion element 24, and the blue filter 38 for guiding incoming light is disposed on the light receiving surface of the third photoelectric conversion element 22.

An infrared transmitting filter for guiding incoming light is disposed on the light receiving surface of the photoelectric conversion element 52, and only infrared light enters the photoelectric conversion element 52. The infrared transmitting filter is configured, for example, by superimposing the red filter 36 and the blue filter 38. The photoelectric conversion element 52 selectively outputs the infrared signal IR for correcting the infrared component included in the output signals R, G, and B of the first, second, third, and fourth photoelectric conversion elements 18, 20, 22, 24.

The output signals from the color image capture element 50 of the present embodiment includes the infrared signal IR at every period of each horizontal line signal. If signal IR exceeds a predetermined intensity, for example, the color signal processing circuit 14 that inputs the output signals from the color image capture element 50 determines that the image capture signals R, G, and B contain a large amount of infrared components, selects a color signal pattern suitable for subjects having strong infrared components from among predetermined color signal patterns, and performs color signal processing for the selected pattern.

Due to the color image capture element 50, high resolution image capture can be performed since the color separation photoelectric conversion elements for photoelectric conversion of the infrared component and the visible light component for image capture can be closely arranged, and appropriate color reproduction can be performed since the infrared component of the subject is detected and the infrared signal for correcting the infrared component can be selectively output. Namely, the first, second, third, and fourth photoelectric conversion elements 18, 20, 22, 24 for detecting the primary colors in the visible light region can be closely arranged so that high resolution image capture can be performed, and photoelectric conversion can be efficiently performed on the light from the subject since there is no intervening infrared-cut filter to cause a loss in the incoming light at the light receiving surfaces of the first, second, third, and fourth photoelectric conversion elements 18, 20, 22, 24. Furthermore, the first, second, third, and fourth photoelectric conversion elements 18, 20, 22, 24 perform photoelectric conversion on both the visible light component and infrared component and luminance signals can be obtained from both the visible light component and infrared component so that sensitivity improves compared to the conventional color image capture element that received only the visible light component. Moreover, since infrared light is detected and can be selectively output, the color signal processing is performed so that appropriate color reproduction can be achieved by adjusting the white balance of the color signals on the basis of the infrared signal IR so that the influence of the infrared component from the red signal, green signal, and blue signal the include the infrared component can be reduced, and by controlling the gain of the red signal and the blue signal with reference to the gain of the green signal.

According to the embodiment as described hereinabove, the sensitivity of the infrared region of the photoelectric conversion elements is effectively used and the luminance signal can be obtained from both the visible component and the infrared component so that the sensitivity of the color image capture apparatus can be improved. Thus, the output signal S/N ratio improves during image capture in dark environments to yield excellent image quality. Furthermore, according to the present invention, true color reproduction can be achieved without the use of infrared-cut filters so that the color image capture apparatus can be realized at low cost and compact size.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A color signal processing circuit for performing white balance adjustment of color signals by obtaining said color signals and an infrared signal that are output from a color image capture element and controlling the gain of at least two signals among said color signals on the basis of said infrared signal, wherein the color image capture element comprises:

a plurality of color components photoelectric conversion elements, each disposed with a color filter on a light receiving surface for respectively transmitting different color components, for receiving incoming light and selectively outputting respective color signals corresponding to the intensity of said different color components; and an infrared component photoelectric conversion element, disposed with an infrared component transmitting filter on a light receiving surface for transmitting an infrared component, for selectively outputting the infrared signal used to correct the infrared component included in at least one of the color signals.

2. A color signal processing circuit according to claim 1, wherein said different color components are red, green, and blue; and the gains of red and blue signals are controlled using the gain of green signal as a reference.

3. A color signal processing circuit according to claim 2, wherein when the infrared signal is larger than a predetermined signal amount, a control operation is performed to reduce the gain of the red signal by a first predetermined amount and to increase the gain of the blue signal by a second predetermined amount.

4. A color signal processing circuit according to claim 2, wherein when the infrared signal is smaller than a predetermined signal amount, a control operation is performed to equalize the gain of the red signal and the gain of the blue signal.

5. A color signal processing circuit according to claim 1, wherein said different color components are three colors or four colors included in one combination of yellow, cyan, and magenta, or combination of yellow, cyan, and green, or combination of yellow, cyan, magenta, and green.

6. A color signal processing circuit for compensating for an infrared component, wherein the color signal processing circuit obtains color signals and an infrared signal that are output from a color image capture element, wherein the color image capture element comprises:

a plurality of color component photoelectric conversion elements, each disposed with a color filter on a light receiving surface for respectively transmitting different color components, for receiving incoming light and selectively outputting respective color signals corresponding to the intensity of said different color components; and an infrared component photoelectric conversion element, disposed with an infrared component transmitting filter on a light receiving surface for transmitting an infrared component, for selectively outputting the infrared signal used to correct the infrared component included in at least one of the color signals; and the color signal processing circuit subtracts, from each of said color signals is, a signal value obtained by multiplying the infrared signal by a coefficient in accordance with a ratio of infrared sensitivity of the corresponding color filter to infrared sensitivity of the infrared component transmitting filter.

7. A color signal processing circuit according to claim 6, wherein said color component photoelectric conversion elements and said infrared component photoelectric conversion element are disposed in a mosaic array in two dimensions.

* * * * *